(12) United States Patent
Goldstein

(10) Patent No.: US 6,730,615 B2
(45) Date of Patent: May 4, 2004

(54) HIGH REFLECTOR TUNABLE STRESS COATING, SUCH AS FOR A MEMS MIRROR

(75) Inventor: Michael Goldstein, Ridgefield, CT (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 10/079,614

(22) Filed: Feb. 19, 2002

(65) Prior Publication Data

US 2003/0155632 A1 Aug. 21, 2003

(51) Int. Cl.$^7$ ............................................. H01L 21/31
(52) U.S. Cl. ...................... 438/769; 438/954; 438/691; 438/692; 438/106; 438/712; 438/769
(58) Field of Search .................. 438/769, 69, 96, 438/97, 763, 636, 669, 780, 712, 106, 691, 692, 954; 427/163.2, 578, 579, 255, 255.1, 255.7, 248.1, 166, 167, 165; 428/209, 210

(56) References Cited

U.S. PATENT DOCUMENTS

| | | | | |
|---|---|---|---|---|
| 4,963,012 A | * | 10/1990 | Tracy et al. | 350/641 |
| 5,505,989 A | * | 4/1996 | Jenkinson | 427/166 |
| 5,574,744 A | * | 11/1996 | Gaw et al. | 372/50 |
| 5,589,233 A | * | 12/1996 | Law et al. | 427/579 |
| 5,619,059 A | * | 4/1997 | Li et al. | 257/431 |
| 5,745,291 A | * | 4/1998 | Jenkinson | 359/586 |
| 5,786,068 A | * | 7/1998 | Dorfman et al. | 428/209 |
| 6,013,980 A | * | 1/2000 | Goel et al. | 313/495 |
| 6,078,425 A | * | 6/2000 | Wolfe et al. | 359/584 |
| 6,233,087 B1 | * | 5/2001 | Hawkins et al. | 359/290 |
| 6,441,359 B1 | * | 8/2002 | Cozier et al. | 250/216 |
| 6,486,597 B1 | * | 11/2002 | Goel et al. | 313/422 |
| 2002/0159172 A1 | * | 10/2002 | Kozhukh | 359/885 |

* cited by examiner

*Primary Examiner*—Nathan J. Flynn
*Assistant Examiner*—Fazli Erdem
(74) *Attorney, Agent, or Firm*—Blakely, Sokoloff, Taylor & Zafman LLP

(57) ABSTRACT

An optical device having a high reflector tunable stress coating includes a micro-electromechanical system (MEMS) platform, a mirror disposed on the MEMS platform, and a multiple layer coating disposed on the mirror. The multiple layer coating includes a layer of silver (Ag), a layer of silicon dioxide ($SiO_2$) deposited on the layer of Ag, a layer of intrinsic silicon (Si) deposited on the layer of $SiO_2$, and a layer of silicon oxynitride ($SiO_xN_y$) deposited on the layer of Si. The concentration of nitrogen is increased and/or decreased to tune the stress (e.g., tensile, none, compressive).

11 Claims, 3 Drawing Sheets

200

300

400

HIGH REFLECTOR TUNABLE STRESS COATING, SUCH AS FOR A MEMS MIRROR

BACKGROUND OF THE INVENTION

1. Field of the Invention

The present invention is related to optical networks and, in particular, to a coating for a micro-electromechanical systems (MEMS) mirror.

2. Background Information

Integrated circuits are formed on semiconductor wafer substrates by a number of processing steps. These steps include deposition, etching, implantation, doping, and other semiconductor processing steps well known to those skilled in the art. Thin films can be formed on wafer surfaces by a deposition process as well. These thin films can comprise, for example, silicon dioxide, doped glasses, silicides, etc. The thickness of such films usually ranges from about a few hundred angstroms to several micrometers. Often, three or more film layers are formed on the surface of a single semiconductor wafer. Deposition of such films can cause stress on the wafer, however.

In the art of fabricating semiconductor wafers, it is of known importance to minimize or control stresses in surface films. High surface stresses can cause the wafer to be deformed. For example, a compressive stress in a surface film will cause a wafer to slightly bow in a convex direction, while a tensile stress in a surface film will cause a wafer to slightly bow in a concave direction. Therefore, both compressive and tensile stresses cause the surface of the semiconductor wafer to deviate from exact planarity.

Lowering the temperature used when depositing a film can reduce stresses. Unfortunately, lowering the deposition temperature tends to lower the quality of the devices that will use the wafer. For example, when wafer processing is used in the manufacture of a micro-electromechanical system (MEMS) mirror, the stresses may tend to cause the mirror to bow slightly, and these deviations in the mirror's shape tend to cause coupling losses. MEMS mirrors tend to be very thin, on the order of a micron, and are particularly sensitive to stress. This is especially troublesome considering that current MEMS mirrors already tend to suffer from poor wavelength dependence, relatively low reflectivity, and other limitations, such as bandwidth and/or data rate limitations.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Embodiments of the present invention are directed to a multiple layer coating for a photonic device. The coating prescription provides a tunable stress that may be varied from tensile to compressive, a tunable index of refraction that may be varied from low to high, and a tunable shape for the resulting optical device that may be varied from concave to convex. Within the wavelength band of interest, the coating also exhibits high reflectivity (e.g., greater than approximately ninety-nine percent) and wavelength independence. The photonic device may be a micro-electromechanical system (MEMS) mirror such as for a MEMS mirror-based optical cross-connect (OXC) switch or optical add/drop multiplexer (OADM). Such photonic-devices may be fabricated using standard semiconductor or MEMS processes (e.g., standard deposition temperatures).

In the following description, numerous specific details, such as particular processes, materials, devices, and so forth, are presented to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring embodiments of various embodiments of the invention.

Some parts of the description will be presented using terms such as stress, silicon, reflectivity, spectrum, reflectance, and so forth. These terms are commonly employed by those skilled in the art to convey the substance of their work to others skilled in the art.

Various operations will be described as multiple discrete blocks performed in turn in a manner that is most helpful in understanding the invention. However, the order in which they are described should not be construed to imply that these operations are necessarily order dependent or that the operations be performed in the order in which the blocks are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
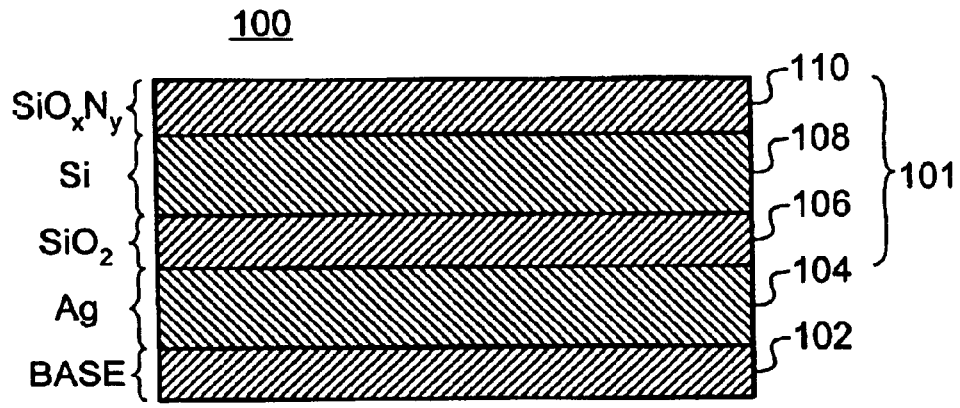
FIG. 1 is a cross-section view of a photonic device according to an embodiment of the present invention.

FIG. 1 is a cross-section view of a photonic device 100 according to an embodiment of the present invention. The example photonic device 100 includes a multiple layer coating 101 and a base 102. The multiple layer coating 101 includes a layer of silver (Ag) 104 on the base 102, a layer of silicon oxide (SiO$_2$) 106 on the layer of Ag 104, a layer of silicon (Si) 108 on the layer of SiO$_2$ 106, and a layer of silicon oxynitride (SiO$_x$N$_y$) 110 on the layer of Si 108.

In an alternative embodiment of the present invention, the layer 104 may be a layer of gold (Au) rather than Ag. Alternatively still, the silicon dioxide (SiO$_2$) layer 106 may include a different dielectric material, such as silver dioxide (AgO$_2$), for example, or may include a second layer of silicon dioxide (SiO$_2$) along with a layer of Ag O$_2$.

Each layer 104, 106, 108, and 110 of the example photonic device 100 has certain physical properties. For example, the layer of Ag 104 has a physical thickness of at least approximately one hundred nanometers, the layer of SiO$_2$ 106 has a physical thickness of approximately two hundred seventy nanometers, and the layer of Si 108 has a physical thickness of approximately fifty nanometers. The layer SiO$_x$N$_y$ 110 has a physical thickness that varies from approximately one hundred ten nanometers. The layer SiO$_x$N$_y$ 110 also has a percentage of N$_y$ that varies from approximately sixty percent N$_y$ to twenty percent N$_y$.

Each layer 104, 106, 108, and 110 of the example photonic device 100 also has optical properties. For example, the layer of SiO$_2$ 106 has an optical thickness of approximately one quarter of a wavelength of interest within a band of wavelengths of interest, the layer of Si 108 has an optical thickness of approximately 0.41 quarter of the wavelength, and the layer SiO$_x$N$_y$ 110 has an optical thickness of approximately 0.44 quarter of the wavelength.

The photonic device 100 has a stress that may be tunable from tensile to compressive. For example, in embodiments in which the ratio of N$_y$ is approximately sixty percent N$_y$, the photonic device stress is tensile. In embodiments in which the ratio of N$_y$ is approximately forty percent N$_y$, the photonic device experiences no significant stress. In embodiments in which the ratio of N$_y$ is approximately twenty percent N$_y$, the photonic device stress is compressive.

Of course, other ratios of N$_y$ are possible and persons of ordinary skill in the relevant art(s) will readily recognize how to implement other stresses by varying the ratio of O$_x$ to N$_y$ in the layer SiO$_x$N$_y$ 110. These methods include, but are not limited to, changes in contaminant levels (such as hydrogen), deposition rate, deposition temperature, buffer gas selection and pressures, as well as ion bombardment assisted deposition.

The photonic device 100 has an index of refraction that is tunable from low to high. For example, in embodiments in which the ratio N$_y$ is approximately sixty percent N$_y$, the photonic device index of refraction is relatively high (e.g., approximately 2.0). In embodiments in which the ratio of N$_y$ is approximately twenty percent N$_y$, the photonic device index of refraction is relatively low (e.g., approximately 1.44). Of course, other ratios of N$_y$ are possible and persons of ordinary skill in the relevant art(s) will readily recognize how to implement other indices of refraction by varying the ratio of N$_y$ to other material components in the layer primarily made of SiO$_x$N$_y$ 110.

The optical path length through the multiple layer coating 101 is held substantially constant by adjusting the layer SiO$_x$N$_y$ 110 physical thickness in inverse proportion to the change in index of refraction. Of course, the exact stress values and indices of refraction may depend on photonic device 100 fabrication process conditions, such as temperature of deposition of the layers, rate of deposition of the layers, ion bombardment deposition of the layers, and content of hydrogen and/or other impurities in plasma deposition. The fabrication process is described below with reference to FIG. 7.

The base 102 may be a substrate, such as a silicon, silicon-on-insulator (SOI), glass, aluminum oxide, silicon-on-sapphire (SOS) substrate, or other suitable substrate. Alternatively, the base 102 may be a micro-electromechanical system (MEMS) mirror. Other suitable bases will be readily apparent to persons of ordinary skill in the relevant art(s).

Figure 2:
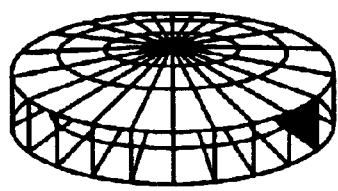
FIG. 2 is a perspective view of the high reflector coating of FIG. 1 disposed on MEMS mirror, which is tuned to have compressive stress according to an embodiment of the present invention.

The photonic device 100 has a shape that may vary from concave to convex. For example, in embodiments in which the ratio of N$_y$ is approximately twenty percent N$_y$, the photonic device shape is convex. FIG. 2 illustrates a convex photonic device 200 according to embodiments of the present invention.

Figure 3:
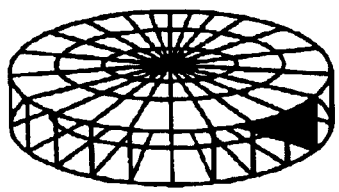
FIG. 3 is a perspective view of the high reflector coating of FIG. 1 disposed on MEMS mirror, which is tuned to have substantially no stress according to an embodiment of the present invention.

In embodiments in which the ratio of N$_y$ is approximately forty percent N$_y$, the photonic device shape is substantially flat. FIG. 3 illustrates a flat photonic device 300 according to embodiments of the present invention.

Figure 4:
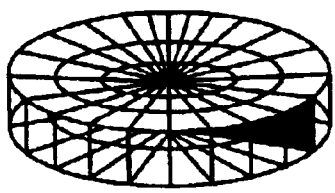
FIG. 4 is a perspective view of the high reflector coating of FIG. 1 disposed on MEMS mirror, which is tuned to have tensile stress according to an embodiment of the present invention.

In embodiments in which the ratio of N$_y$ is approximately sixty percent N$_y$, the photonic device shape is concave. FIG. 4 illustrates a concave photonic device 400 according to embodiments of the present invention. Of course, other ratios of N$_y$ are possible and persons of ordinary skill in the relevant art(s) will readily recognize how to implement other shapes by varying the ratio of N$_y$ in the layer SiO$_x$N$_y$ 110.

Figure 5:
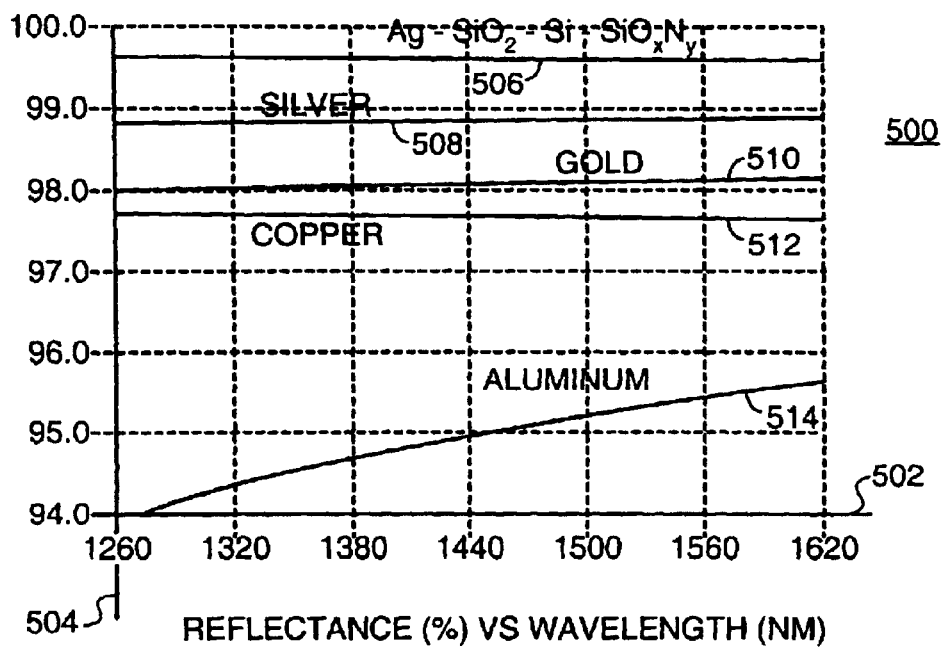
FIG. 5 is a graphical representation of a reflectance spectrum of the high reflector coating of FIG. 1 in response to incident light near the 1260–1620 nm band in FIG. 1 according to an embodiment of the present invention as related to metallic reflectors.

The photonic device 100 exhibits high reflectivity (e.g., greater than approximately 99.5 percent) within a wavelength band of interest. FIG. 5 is a graphical representation of a reflectance spectrum 500 of the multiple layer coating 101 in response to incident light near the 1260–1620 nm band according to an embodiment of the present invention as related to metallic reflectors. The reflectance spectrum 500 includes an "x" axis 502, which represents wavelength in nanometers, and a "y" axis 504, which represents reflectance in percentage.

The reflectance spectrum 500 includes a curve 506, which represents the reflectance (or reflectivity) of the multiple layer coating 101 for light having a wavelength in a range of approximately 1260 nm to 1620 nm. The reflectance spectrum 500 also compares the reflectance of the multiple layer coating 101 to the reflectance of silver (curve 508), gold (510), copper (512), and aluminum (514). This illustrates that the multiple layer coating 101 also exhibits substantial wavelength independence. Note that the reflectance of the multiple layer coating 101, silver, gold, and copper are substantially flat across the range of wavelengths. However, only the multiple layer coating 101 has a reflectance greater than ninety-nine percent over such a broad band of wavelengths.

Figure 6:
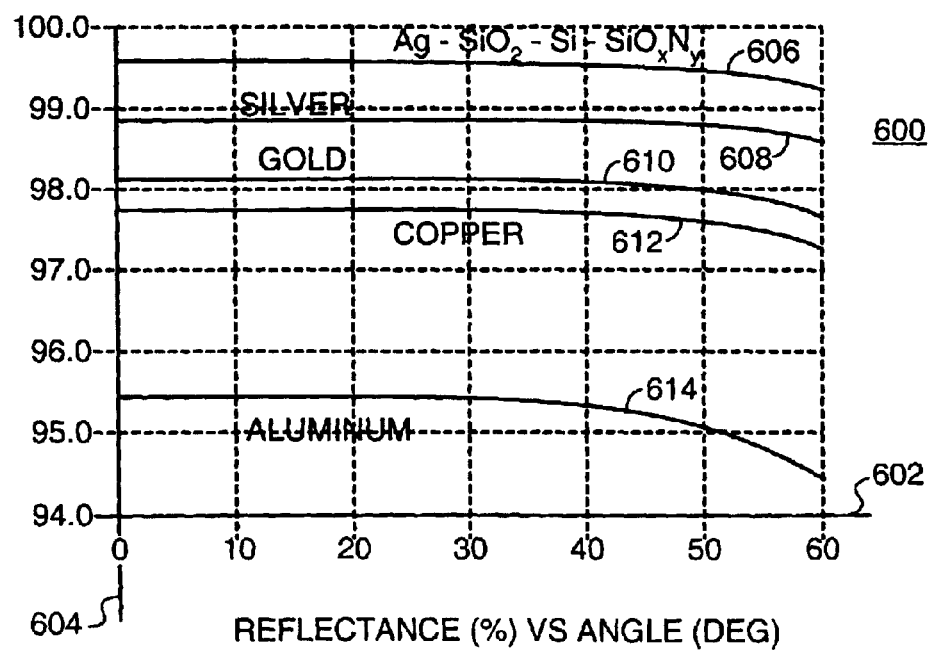
FIG. 6 is a graphical representation of an angular spectrum of the high reflector coating of FIG. 1 in response to incident light near 1550 nm in FIG. 1 according to an embodiment of the present invention as related to metallic reflectors.

FIG. 6 is a graphical representation of an angular spectrum 600 of the multiple layer coating 101 in response to incident light near 1550 nm according to an embodiment of the present invention as related to metallic reflectors. The reflectance spectrum 600 includes an "x" axis 602, which represents angle of incidence of light in degrees, and a "y" axis 604, which represents reflectance in percentage.

The angular spectrum 600 includes a curve 606, which represents the reflectance (or reflectivity) of the multiple layer coating 101 for light having a wavelength in a range of approximately 1550 nm (which is near the middle of standard communication windows, e.g., between C-band and L-band). The reflectance spectrum 600 also compares the reflectance of the multiple layer coating 101 to the reflectance of silver (curve 608), gold (610), copper (612), and aluminum (614). The angular spectrum 600 illustrates that the multiple layer coating 101 also exhibits substantial independence across a broad range of angles of incidence (e.g., approximately zero to sixty degrees). Note that only the multiple layer coating 101 has a reflectance greater than ninety-nine percent over such a broad range of angles of incidence.

That the photonic device(s) 100, 200, 300, 400, and other photonic device according implemented according to embodiments of the present invention exhibit high reflectivity in the second and third communication windows (e.g., ITU II, C-band, L-band, S-band) and minimal optical aberrations indicates that such photonic devices are not bandwidth or data rate limited. For example, such optical devices will be suitable for use as/in optical cross-connects (OXC) and/or optical add/drop multiplexers (OADM) that operate at the optical carrier level 192 (OC-192), which has a data rate of 9.95328 Gigabits per second (Gbps). Alternative embodiments of the present invention may be suitable for use as/in optical cross-connects (OXC) and/or optical add/drop multiplexers (OADM) that operate at OC-768, which has a data rate of 39.81312 Gbps.

Figure 7:
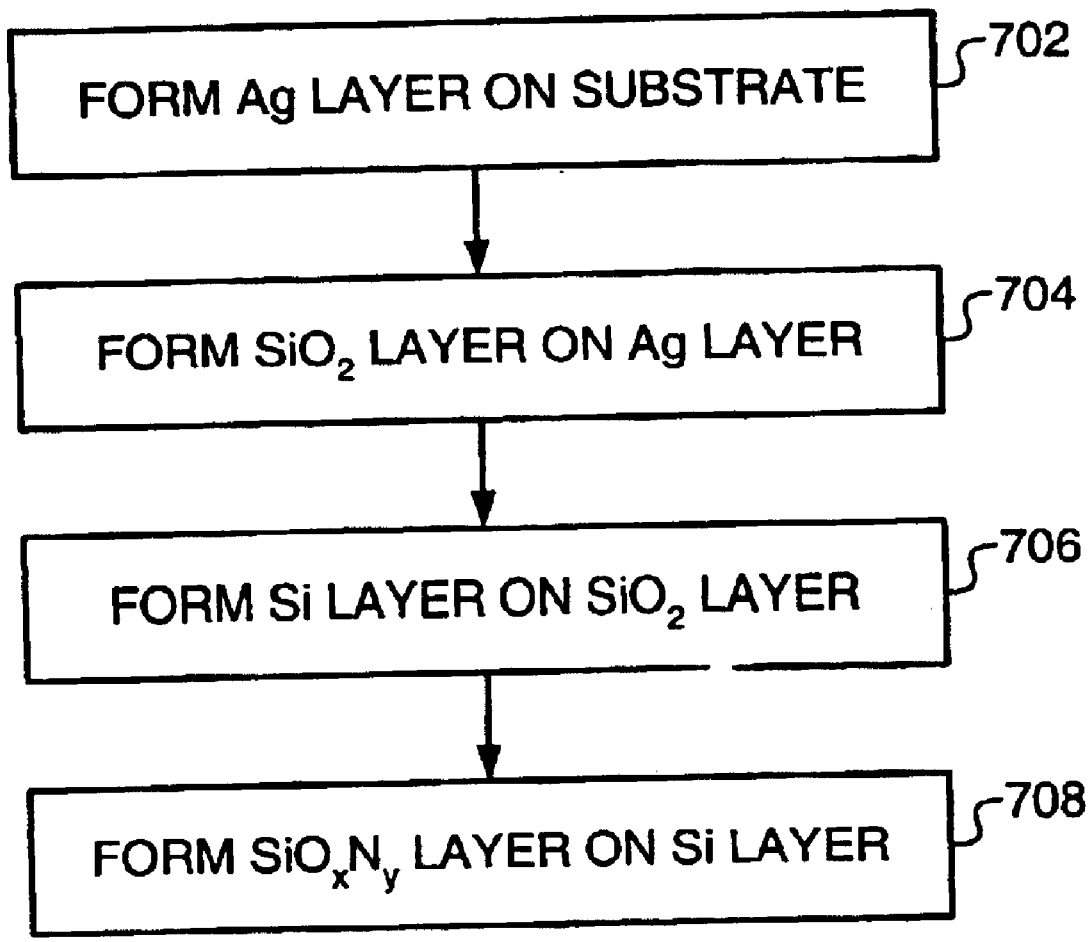
FIG. 7 is a flowchart of an approach to making a photonic device according to an embodiment of the present invention.

FIG. 7 is a flowchart of a process 700 for making a photonic device according to an embodiment of the present invention. A machine-readable medium having machine-readable instructions thereon may be used to cause a processor to perform the process 100. In general, the process 100 is implemented using standard semiconductor and MEMS fabrication techniques, such as implantation, doping, evaporation, chemical-vapor deposition, physical vapor deposition, ion assisted deposition, magnetron sputtering, electron beam sputtering, evaporation, masking, reactive ion etching, and/or other semiconductor processing techniques well known to those skilled in the art.

A block 702 forms a layer of silver (Ag) on a substrate. The layer of Ag may have a physical thickness of at least approximately one hundred nanometers.

A block 704 forms a layer of silicon dioxide ($SiO_2$) on the layer of Ag. The layer of silicon dioxide ($SiO_2$) may have a physical thickness of approximately two hundred seventy nanometers and an optical thickness of approximately one quarter of a wavelength for a wavelength of interest.

A block 706 forms a layer of silicon (Si) on the layer of $SiO_2$. The layer of silicon (Si) may have a physical thickness of approximately fifty nanometers and an optical thickness of approximately forty-one one-hundredths of one quarter of the wavelength of interest in the material.

A block 708 forms a layer of silicon oxynitride ($SiO_xN_y$) on the layer of silicon (Si). The layer of $SiO_xN_y$ may have a physical thickness within a range from of approximately one hundred nanometers to one hundred ten nanometers, a ratio of $N_y$ within a range from approximately sixty percent $N_y$ to twenty percent $N_y$, and an optical thickness of approximately 0.44 quarter of the wavelength in the material.

Embodiments of the invention can be implemented using hardware, software, or a combination of hardware and software. In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:

forming a layer of silver (Ag) having a first physical thickness on a substrate;

forming a layer of silicon oxide ($SiO_2$) having a second physical thickness on the layer of Ag;

forming a layer of silicon (Si) having a third physical thickness on the layer of $SiO_2$; and tuning a layer of silicon oxynitride ($SiO_xN_y$) on the layer of Si to a fourth physical thickness, a ratio of $N_y$ within a range of interest, and an optical thickness of a percentage of a quarter of a wavelength of interest within a band of wavelengths of interest.

2. The method of claim 1, wherein forming the layer of $SiO_xN_y$ comprises sputter-depositing the layer of $SiO_xN_y$ on the layer of Si.

3. The method of claim 1, wherein forming the layer of Si comprises evaporating Si on the layer of $SiO_2$.

4. The method of claim 1, wherein the first physical thickness is approximately one hundred nanometers.

5. The method of claim 4, wherein the second physical thickness is approximately two hundred seventy nanometers.

6. The method of claim 5, wherein the third physical thickness is approximately fifty nanometers.

7. The method of claim 6, wherein tuning the layer of $SiO_xN_y$ on the layer of Si comprises tuning the layer of $SiO_xN_y$ to a physical thickness within a range from approximately one hundred nanometers to one hundred ten nanometers, a ratio of $N_y$ within a range from approximately sixty percent $N_y$ to twenty percent $N_y$, and an optical thickness of approximately 0.44 quarter of the wavelength.

8. The method of claim 1, wherein tuning the layer of $SiO_xN_y$ on the layer of Si comprises tuning the layer of $SiO_xN_y$ to an index of refraction and a reflectance greater than ninety-nine percent over the range of angles of incidence.

9. A method, comprising:

forming a layer of gold (Au) having a first physical thickness on a substrate;

forming a layer of dielectric material having a second physical thickness on the layer of Au;

forming a layer of silicon (Si) having a third physical thickness on the layer of dielectric material; and tuning a layer of silicon oxynitride ($SiO_xN_y$) on the layer of Si to a fourth physical thickness, a ratio of $N_y$ within a range of interest, and an optical thickness of a percentage of a quarter of a wavelength of interest within a band of wavelengths of interest.

10. The method of claim 9, wherein forming a layer of dielectric material having a second physical thickness on the layer of Au comprises forming a layer of silver dioxide ($AgO_2$) having a second physical thickness on the layer of Au.

11. The method of claim 9, wherein forming at least one of the layers of Au, dielectric material, Si, or $SiO_xN_y$ comprises forming at least one of the layers of Au, dielectric material, Si, or $SiO_xN_y$ by at least one of implantation, doping, evaporation, physical vapor deposition, ion assisted deposition, magnetron sputtering, electron beam sputtering, masking, or reactive ion etching.

* * * * *